US009240243B2

(12) United States Patent
Matranga et al.

(10) Patent No.: US 9,240,243 B2
(45) Date of Patent: Jan. 19, 2016

(54) MANAGING OF THE ERASING OF OPERATIVE PAGES OF A FLASH MEMORY DEVICE THROUGH SERVICE PAGES (71) Applicant: STMicroelectronics S.r.l., Agrate Brianza (MI) (IT)

(72) Inventors: Giovanni Matranga, Catania (IT); Mario Micciche, Agrigento (IT); Rosario Roberto Grasso, Acicastello (IT)

(73) Assignee: STMICROELECTRONICS S.R.L., Argate Brianza (MB) (IT)

( * ) Notice: Subject to any disclaimer, the term of this patent is extended or adjusted under 35 U.S.C. 154(b) by 87 days.

(21) Appl. No.: 13/860,056

(22) Filed: Apr. 10, 2013

(65) Prior Publication Data

US 2013/0272068 A1 Oct. 17, 2013

(30) Foreign Application Priority Data

Apr. 12, 2012 (IT) .............................. MI2012A0595

(51) Int. Cl.
G11C 16/00 (2006.01)
G11C 16/16 (2006.01)
G11C 16/22 (2006.01)

(52) U.S. Cl.
CPC ................ G11C 16/16 (2013.01); G11C 16/22 (2013.01)

(58) Field of Classification Search
CPC ....................................................... G11C 16/00
USPC ...................................................... 365/185.05
See application file for complete search history.

(56) References Cited

U.S. PATENT DOCUMENTS

| 6,381,177 | B1 | 4/2002 | De Sandre et al. |
| 6,977,847 | B2 | 12/2005 | Lasser et al. |
| 2002/0085433 | A1 | 7/2002 | Tomori et al. |
| 2003/0123287 | A1* | 7/2003 | Gorobets ................. 365/185.11 |
| 2004/0151030 | A1 | 8/2004 | Chang et al. |
| 2004/0218440 | A1* | 11/2004 | Kumar et al. ................. 365/202 |
| 2005/0144362 | A1 | 6/2005 | Lin et al. |
| 2008/0055990 | A1 | 3/2008 | Ishikawa et al. |
| 2008/0158963 | A1* | 7/2008 | Kozakai et al. ........... 365/185.09 |
| 2008/0158980 | A1* | 7/2008 | Kamei et al. ............. 365/185.19 |
| 2009/0161466 | A1* | 6/2009 | Hamilton et al. ............. 365/222 |
| 2011/0122696 | A1* | 5/2011 | Kajimoto ................. 365/185.11 |

* cited by examiner

*Primary Examiner* — Min Huang
(74) *Attorney, Agent, or Firm* — Allen, Dyer, Doppelt, Milbrath & Gilchrist, P.A.

(57) ABSTRACT

A method for managing a flash memory device including pages of memory cells is described. The memory device may be erasable at the page level, and the pages may include operative pages for storing operative values and service pages for storing information relating to the erasing of the operative pages. In response to a request to erase selected operative pages, the method may include determining a service page in use among the service pages according to service information stored in the service pages, verifying the presence a service page to be erased, and applying an erasing pulse to each service page to be erased. The method may also include writing an address of the operative pages into the service page in use, erasing the selected operative pages, and writing a completion indication of the erasing of the selected operative pages into the service page in use.

27 Claims, 4 Drawing Sheets

MANAGING OF THE ERASING OF OPERATIVE PAGES OF A FLASH MEMORY DEVICE THROUGH SERVICE PAGES

FIELD OF THE DESCRIPTION

The present invention relates to the electronics field. More specifically, such the present invention related to flash memory devices.

BACKGROUND OF THE DESCRIPTION

Flash memory devices may be used in whatever application where it is desirable to store information that should be held even when the flash memory devices are not powered. In general, each flash memory device comprises a matrix of memory cells. Each memory cell typically comprises a floating gate metal oxide semiconductor (MOS) transistor having a drain terminal, a source terminal, and a gate terminal, in a completely similar manner to a standard MOS transistor, with the addition of a further floating gate region that is buried within an oxide layer so as to be electrically insulated.

An information bit is physically stored within each memory cell in the form of electric charge within the floating gate, which defines a corresponding threshold voltage of the transistor. In particular, the memory cell is programmed at a high threshold voltage (electric charges being trapped within the floating gate) and erased at a low threshold voltage (floating gate being free from electric charges). The flash memory device may be programmed at the level of individually selected memory cells, whereas it may be erased only at the level of groups of selected memory cells (for example, one or more pages of memory cells each one being formed in a corresponding insulated well).

As it is known, the erasing of the selected pages takes place by applying a set of erasing pulses with increasing value to each one of them, until all the respective memory cells have been erased. However, this may generate (in such selected pages) depleted memory cells, whose transistors have threshold voltages lower than the low threshold voltage (so that they may be in conduction even if not selected). For this reason, the erasing typically comprises, downstream of the application of the set of erasing pulses, a recovery phase wherein any depleted memory cells are identified and subjected to a soft-programming operation for recovering them to the (erased) non-depleted condition.

If however such recovery phase is not carried out (or completed), such as following up undesired interruptions of electrical power with consequent incorrect shutdown of the flash memory device, the presence of depleted memory cells may cause malfunctions (for example, reading errors). To reduce these occurrences, in the state of the art there are approaches that provide for storing information relating to the erasing of the selected pages within a register of service memory cells. For such purpose, an address of the selected pages is written upon starting of their erasing, and a corresponding flag is written upon completion of the erasing thereof (by programming corresponding memory cells of the service register). In this way, at each power-on of the flash memory device, any selected page that is not completely erased (address being written and flag being not written) may be identified and subjected to erasing (with corresponding soft-programming). However, once the service register has been filled (after a certain number of erasing), it may be necessary to completely erase it before being able to use it again. Therefore, it may be desirable that the service register be relatively large (for limiting its erasing), with consequent significant area occupation. In any case, at each (unavoidable) erasing of the service register, the flash memory device has long latency times, and thus a reduced efficiency.

In addition, the presence of parasitic couplings involves a not complete insulation between the memory cells so that the selection of one or more memory cells (or pages) may cause electrical noise on memory cells (or pages) being not selected, and hence an alteration of the information bits stored therein. Therefore, the memory cells are periodically subjected to a refresh of their content, for example, by a specific re-programming algorithm. However, the refresh, being usually carried out on entire sectors of the memory device (each one typically comprising a large number of pages), requires long execution times, which further reduces the efficiency of the flash memory device.

SUMMARY OF THE INVENTION

In its general terms, the embodiments are based on the idea of storing information relating to the erasing of operative pages within service pages. More specifically, an embodiment is directed to a method for managing a flash memory device, wherein information relating to the erasing of operative pages is stored within two or more service pages. At each erasing of a set of selected operative pages, such information is written into a service page in use and at least one erasing pulse is applied to each service page to be erased.

Another aspect according to an embodiment is directed to a corresponding flash memory device. A further aspect according to an embodiment is directed to a system comprising one or more of such flash memory devices. A different aspect according to an embodiment directed to a program for carrying out such method.

DETAILED DESCRIPTION OF THE PREFERRED EMBODIMENTS

Figure 1:
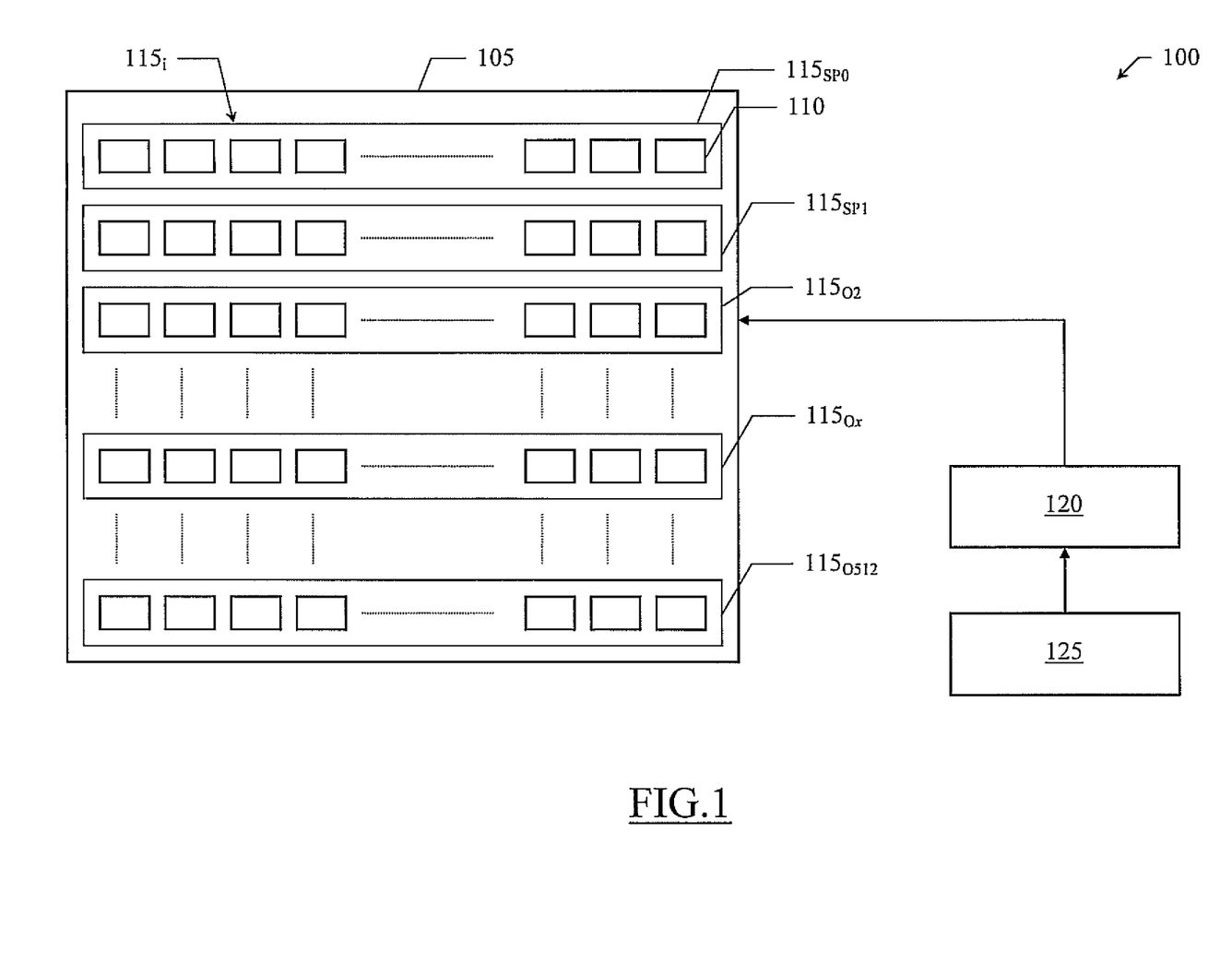
FIG. 1 is a block diagram of a flash memory device for use with a method according to an embodiment of the present invention.

With particular reference to FIG. 1, a flash memory device 100 (for example, a NAND flash memory device) wherein the approach according to an embodiment may be applied is illustrated. The flash memory device 100 is integrated within a chip of semiconductor material. The flash memory device 100 comprises a memory matrix 105, which is formed by a plurality of electrically programmable and erasable memory cells 110, each one for storing a corresponding information bit (represented by a threshold voltage of a corresponding floating-gate MOS transistor). Conventionally, the memory cell 110 being erased (low threshold voltage) is associated with the logical value 1; whereas the memory cell 110 being programmed (high threshold voltage) is associated with the logical value 0.

The memory cells 110 are physically arranged in pages (e.g., rows made in corresponding insulated wells of the chip) $115_i$ (i=1, 2, . . . , 512 in the illustrated example)—for example, each one formed by 2048 memory cells 110. The memory cells 110 may be programmed and read individually, whereas they may be erased only at the level of an entire page $115_i$.

As it is known, the flash memory device 100 comprises peripheral circuits such as decoders, multiplexers, drivers, buffers, sense amplifiers, which, being not relevant for the present description, are represented in the figure by a single functional block, denoted by the reference number 120. Such peripheral circuits 120 are configured, in general, for accessing selected memory cells 110 and/or selected pages $115_i$ (as conceptually represented in the figure by the generic arrow connection between the peripheral circuits 120 and the memory matrix 105) and for running selected operations thereon (i.e., reading, programming or erasing).

The flash memory device 100 further comprises a control circuit (e.g., a microcontroller) 125, which, in general, performs management and control functions (e.g., by properly coordinating enabling and/or disabling of the peripheral circuits 120, as conceptually represented in the figure by the generic arrow connection between the microcontroller 125 and the peripheral circuits 120).

According to an embodiment, the memory matrix 105 is logically split into a plurality of operative pages (differentiated by the reference $115_{Ox}$, with x=2, 3, . . . , 512) and a plurality of service pages (differentiated by the reference $115_{SPy}$, with y=0, 1 in the example at issue). The operative pages $115_{Ox}$ (that take most of the memory matrix 105) are typically used for storing operative values, whereas the service pages $115_{SPy}$ are used for storing information relating to the erasing of the operative pages $115_{Ox}$.

As described in detail below, the service pages $115_{SP0}$, $115_{SP1}$ are used alternately, with a service page $115_{SP0}$, $115_{SP1}$ that is erased from time to time while the other service page $115_{SP1}$, $115_{SP0}$ is in-use. This allows dynamically managing the service pages $115_{SP0}$, $115_{SP1}$ together with the erasing of the set of selected operative pages $115_{Ox}$. Furthermore, the erasing of the service pages $115_{SP0}$, $115_{SP1}$ not in-use takes place in a distributed manner. In this way, at least one empty service page $115_{SP0}$, $115_{SP1}$ is available upon filling of the service page $115_{SP0}$, $115_{SP1}$ in-use, which allows reducing the latency time of the flash memory device 100.

Moreover, the managing procedure is able to operate in an optimum manner with a very small number of service pages $115_{SP0}$, $115_{SP1}$. Therefore, it may not be desirable to use, as in the known approaches, non-volatile memory registers external to the memory matrix 105, which would result in a considerable area occupation of the whole flash memory device 100.

Figure 2:
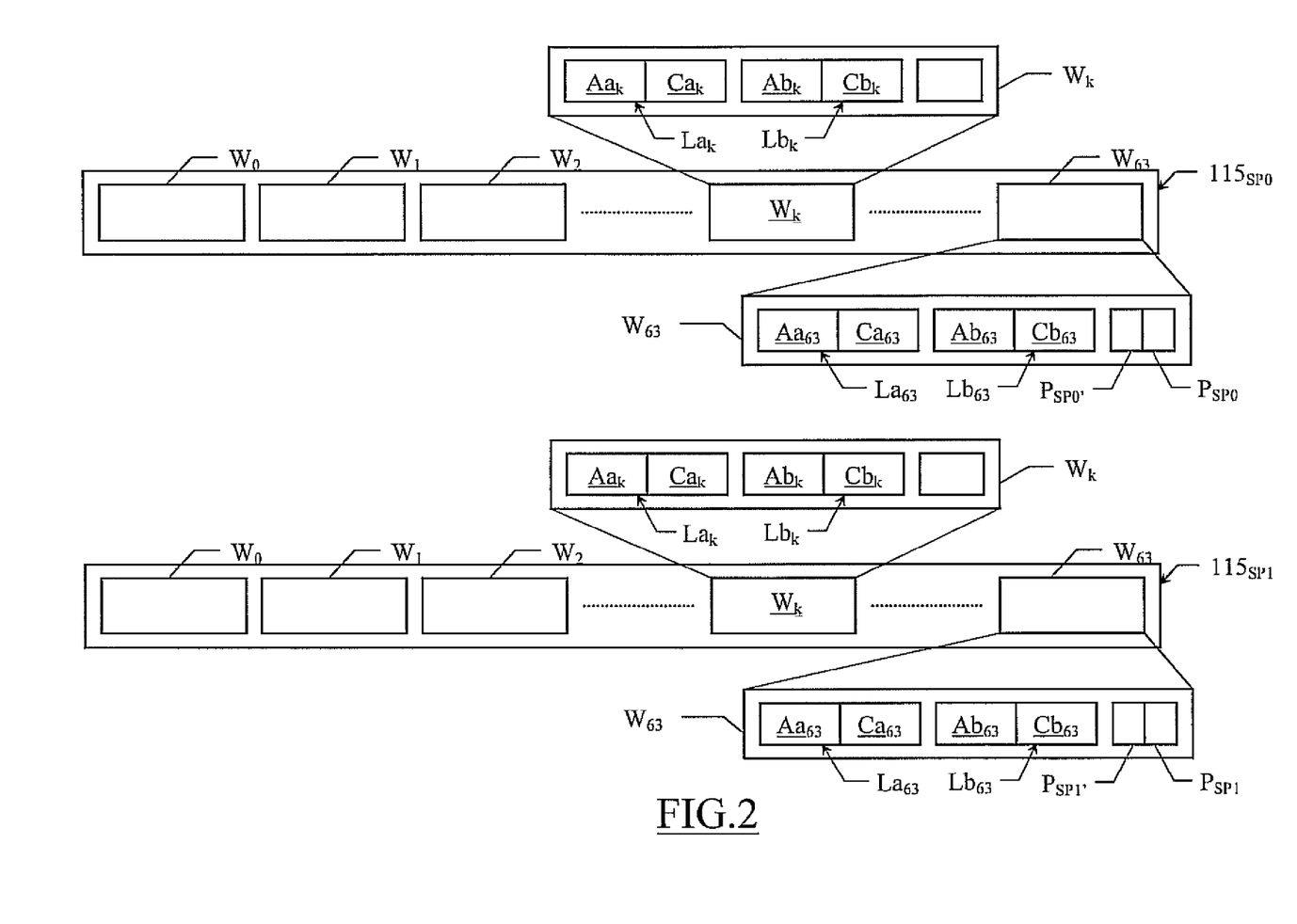
FIG. 2 is a schematic diagram of service pages comprised in a flash memory device that may be used for implementing a management procedure according to an embodiment of the present invention.

FIG. 2 shows a schematic representation of the service pages $115_{SP0}$, $115_{SP1}$ according to an embodiment. More particularly, such figure shows an exemplary logical arrangement of each service page $115_{SP0}$, $115_{SP1}$ that may be used for implementing a managing procedure according to an embodiment.

Each service page $115_{SP0}$, $115_{SP1}$ comprises a plurality of words $W_k$ (in the example at issue, k=0, 1, 2 . . . , N, with N=63)—for example, each one being formed by 32 bits. Each word $W_k$ comprises, as visible in the detail shown in the figure for the generic word $W_k$, one or more (e.g., two) memory locations, or simply locations, $La_k$, $Lb_K$ (each one of 16 bits), each one for storing the information relating to the erasing of a corresponding set of selected operative pages. More particularly, the location $La_k$, $Lb_K$ comprises an address section $Aa_k$, $Ab_K$ (for example, formed by the first 10 bits, able to address up to $2^{10}$=1028 pages of the memory matrix) for storing an address of the set of selected operative pages, and a location indicator $Ca_k$, $Cb_K$ (for example, formed by the subsequent 4 bits) for storing values indicative of a state of the location $La_k$, $Lb_K$ and the erasing of the set of selected operative pages—with the remaining 4 bits of each word $W_k$ that are unused (except for the last word $W_{63}$, as described below).

Each location indicator $Ca_k$, $Cb_K$ may take a free value (for example, equal to 1111) indicating that the location $La_k$, $Lb_K$ is free, a selection value (for example, equal to 0111) indicating that the location $La_k$, $Lb_K$ has been selected, a verification value (for example, equal to 0011) indicating the occurred verification of service pages under erasing, a writing value (e.g., equal to 0001) indicating the occurred writing of the address of the set of selected operative pages into the address section $Aa_k$, $Ab_K$, and an erased value (e.g., equal to 0000) indicating the completion of the erasing of the set of selected operative pages.

The free, selection, verification, writing and erased values reflect, in this order, a sequence of steps of the management procedure (as will be described below). Thus, they have been chosen so as to differ from each other by a growing number of programmed bits—i.e. 1111, 0111, 0011, 0001 and 0000, respectively. In this way, starting from the free value 1111 (obtained after the erasing of the corresponding service page), the location indicator $Ca_k$, $Cb_K$ may be updated through successive programming of different bits, up to the erased value 0000.

The remaining 4 bits of the last word $W_{63}$ of each page comprise two page indicators $P_{SPy}$, $P_{SPy'}$ (for example, formed by the two last bits and the two first bits, respectively, in the illustrated example), the first one (i.e., the indicator $P_{SP0}$, $P_{SP1}$) being indicative of an occupation state of the respective service page $115_{SP0}$, $115_{SP1}$ (or occupation indicator) and the second one (i.e., the indicator $P_{SP0'}$, $P_{SP1'}$) being indicative of a state of the erasing of the other service page $115_{SP1}$, $115_{SP0}$ (or erasing indicator). Each occupation indicator $P_{SPy}$ may take an empty value (for example, equal to 11) indicating that the service page is empty, an in-use value (for example, equal to 10) indicating that the service page is in-use, and a full value (for example, equal to 00) indicating that the service page is full, whereas each erasing indicator $P_{SPy'}$ may take a to-be-started value (for example, equal to 11) indicating that the erasing of the service page has not started yet, an in-progress value (for example, equal to 10) indicating that the erasing of the service page is in progress, and a completed value (for example, equal to 00) indicating that the erasing of the service page has been completed.

Also in this case, the empty, in-use and full values, and the to-be-started, in-progress and completed values reflect, in this order, a sequence of steps of the managing procedure (as will be described below). Thus, they have been chosen so as to differ from each other by growing number of programmed bits—i.e. 11, 10, 00, respectively. In this way, starting from the (empty or to-be-started) value 11, each page indicator $P_{SPy}$, $P_{SPy'}$ may be updated by subsequent programming of different bits, up to the (full or completed) value 00.

Figure 3:
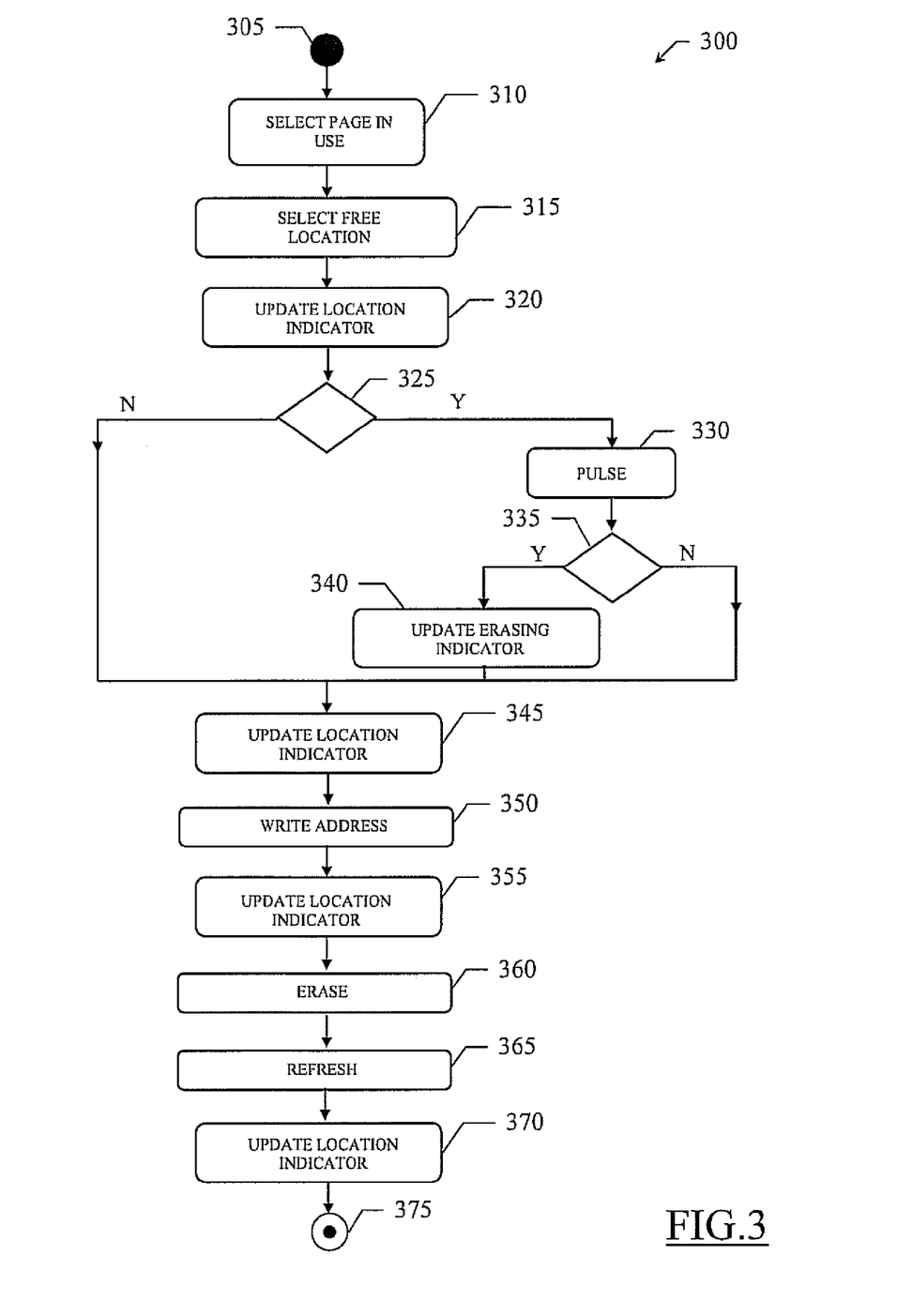
FIGS. 3 and 4 are flow diagrams illustrating operations of respective phases of the management procedure according to an embodiment of the present invention.
Figure 4:
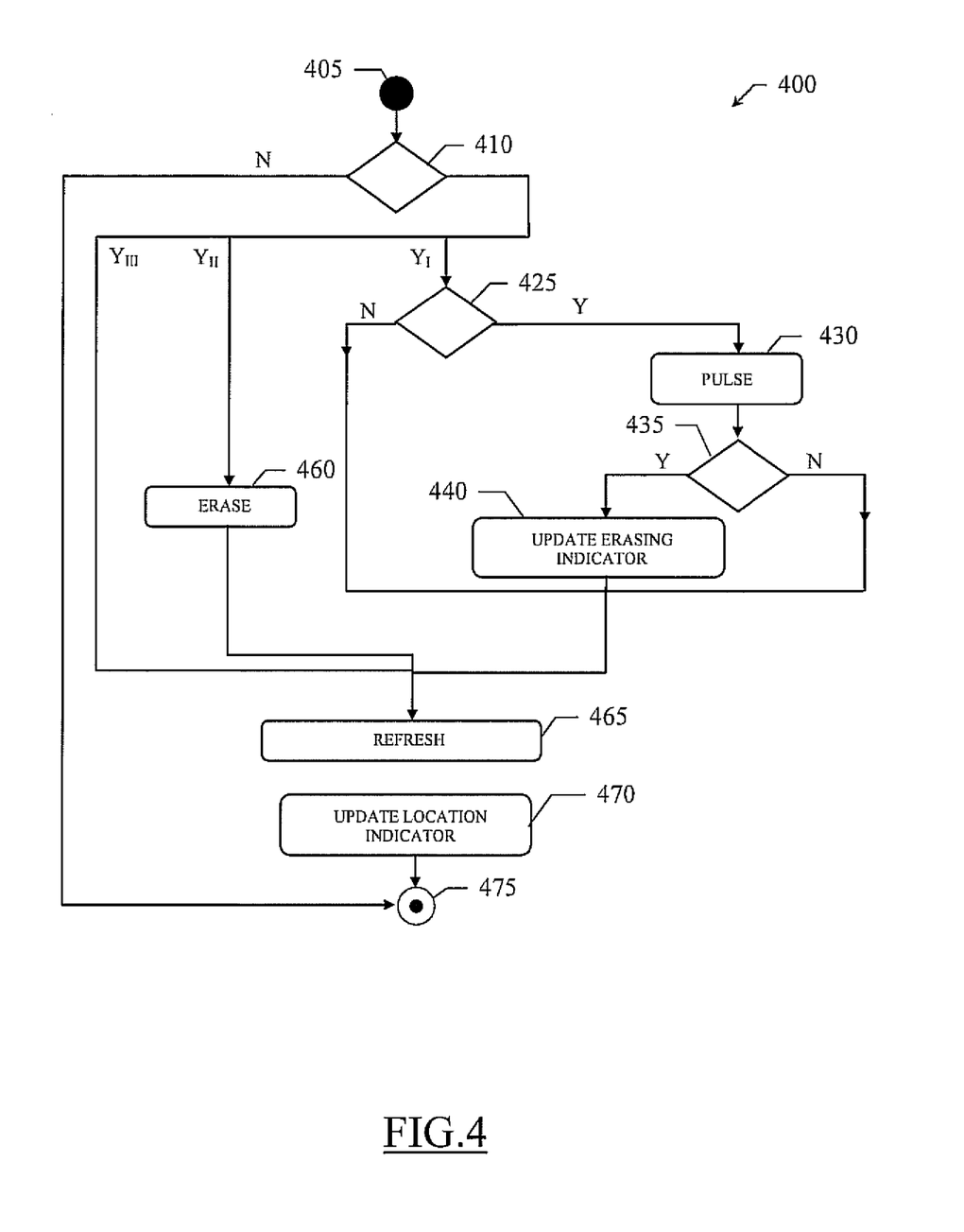

FIGS. 3 and 4 show simplified activity diagrams of the flow of operations of the managing procedure according to an embodiment. Such operations are performed under the control of a corresponding program, which is stored in a base memory of the microcontroller (e.g., a ROM), and is loaded (at least in part) into a working memory thereof (for example, a RAM) when the program is running. The program implements a method for performing the managing procedure, which comprises an erasing phase (described in FIG. 3, and performed at each erasing command of a set of selected operative pages), and a repairing phase (described in FIG. 4, and performed at each power-on of the flash memory device).

With particular reference to FIG. 3, the erasing phase of the method (hereinafter, method 300) starts at the starting black circle 305. The method 300 then continues to the block 310, wherein a service page in use is determined. This is carried out by identifying the service page having the corresponding occupation indicator (stored therein) at the in-use value. In case of first power-on of the flash memory device, condition wherein the occupation indicators are at the empty value, any of the service pages may be chosen according to a suitable criterion (for example, the first service page), afterwards the occupation indicator associated with the chosen service page is updated to the in-use value—i.e., from 11 to 10 (steps not shown).

At this point, a free location in the service page in use is selected (block 315). This is carried out by identifying a location having the corresponding location indicator at the free value. In case that no free location is available in the service page in use (i.e., the service page is full), the occupation indicator of the service page in use is updated to the full value (i.e., from 10 to 00), the occupation indicator of the other service page (which, as will be understood in the following, in such phase is at the empty value) is set to the in-use value (i.e., from 11 to 10), and a free location in the (new) service page in use (always available) is selected. In any case, the method continues to block 320, wherein the location indicator of the selected location is updated to the selection value (i.e., from 1111 to 0111).

The method 300 then continues to the decision block 325, wherein whether the other service page has to be erased is verified. This occurs when the corresponding erasing indicator (stored in the service page in use) is at the to-be-started or in-progress value. In the affirmative case, output branch Y of the decision block 325, an erasing pulse is applied to the other service page (block 330), and, if the corresponding erasing indicator is at the to-be-started value, it is updated to the in-progress value (step not shown). It should be noted that in this way the occupation indicator of the service page under erasing (stored therein) takes an undefined value. Although in general this does not constitute a problem, in the particular case in which this value instead becomes accidentally equal to the in-use value, the determination of the real service page in use at the next erasing phase may be performed, for example, by analyzing the distribution of values of the location indicators—chaotic in the service page under erasing and organized consistent with the present method in the service page in use. The application of even one erasing pulse only at each erasing command ensures that all the memory cells of the service page under erasing have been erased before the filling of the service page in use (in fact, typically for such purpose 5 or 6 erasing pulses are desired—and hence 5 or 6 erasing commands). Downstream from the application of the erasing pulse, a recovery phase is also carried out wherein possible depleted memory cells in the service page under erasing are identified and subjected to a soft-programming for restoring them to the non-depleted (erased) condition.

The method 300 then continues to the decision block 335, wherein there is verified whether the service page under erasing has been completely erased (without depleted memory cells, as above). In the affirmative case, output branch Y of the decision block 335, at block 340 the erasing indicator of the service page under erasing (stored in the service page in use) is updated to the completed value (i.e., from 01 to 00). At the same time, the occupation indicator of the service page just erased is automatically set at the empty value (11). The method 300 then continues to block 345. Otherwise, output branch N of the decision block 335, indicating that the erasing pulse being applied has not been sufficient to completely erase the service page under erasing, the method 300 still continues to block 355. Such block may also be reached directly in the case where, after the selection of the free location in the service page in use, no service page to be erased has been found (output branch N of the decision block 325).

At block 345 the location indicator of the selected location is updated to the verification value (i.e., from 0111 to 0011) indicating the occurred verification of the presence of a service page to be erased and the possible application of the erasing pulse thereto (and the subsequent verification of the complete erasing thereof).

The method 300 continues to block 350, wherein the address of the set of selected service pages is written into the address section of the selected location of the service page in use. Continuing to block 355, the indicator location of the selected location is updated to the writing value (i.e., from 0011 to 0001).

At this point, the set of selected operative pages is erased (block 360). This may be carried out, in a known manner, by applying a number of erasing pulses with increasing value (until all the respective memory cells have been erased), and then soft-programming any depleted memory cells.

The method 300 continues to block 365, wherein a refresh of a set of predefined pages is carried out. Such predefined pages have an address associated in a predefined manner with a position of the selected location in the service page in use. For example, in the case at issue wherein the flash memory device comprises, among the 512 pages, two service pages each one comprising 64 words each one having two locations, it is possible to associate, with the j-th location (with j=0, 1, 2, . . . , 127) of the y-th service page in use, a pair of service pages in succession starting from the address 2*j+h*256 (so as to refresh the first 256 pages in pairs when the first service page is in use and thus the other 256 pages when the second service page is in use). This allows refreshing all the pages within the filling of the two service pages. In this way, with respect to the known art, wherein the refresh is carried out periodically over entire sectors at the end of an erasing, the refresh is distributed over different erasing, which results in a greater efficiency of the flash memory device.

The method 300 continues to block 370, wherein the location indicator of the selected location is updated to the erased value (i.e., from 0001 to 0000). The method 300 then ends at the final double black circle 375.

With reference now to FIG. 4, the repair phase of the method (hereinafter, method 400) starts at the start black circle 405. As mentioned above, the method 400 is invoked at each power-on of the flash memory device. In general, the method 400 is intended to verify whether the power-on of the flash memory device follows an incorrect shutdown of the flash memory device (e.g., caused by undesired power interruptions during the erasing phase).

The method 400 continues to decision block 410, wherein there is verified, in the service pages, the presence of a hybrid memory location, i.e., a memory location having the location indicator at the selection value, the verification value or the writing value. In the negative case (output branch N of the decision block 410), the method ends at the final double circle 475, indicating that the previous shutdown of the flash memory device has occurred correctly (or that, at the time of the shutdown, the erasing phase had already been completed). In the affirmative case, instead, the method 400 branches according to the value of the location indicator of the hybrid memory location.

In particular, if the hybrid memory location has the location indicator at the selection value (output branch $Y_I$ of the decision block 410), there is verified whether the other service page has to be erased (decision block 425). In the affirmative case, output branch Y of the decision block 425, an erasing pulse is applied to such service page with subsequent recovery phase (block 430), and there is verified whether the service page under erasing has been completely erased (decision block 435). In the affirmative case, output branch Y of the decision block 435, at the block 440 the erasing indicator of the service page being now empty (stored in the service page in use) is updated to the completed value; the method 400 then continues to block 465. Such block is also reached directly in case no service page to be erased has been found (output branch N of the decision block 425), and in case the erasing of the service page under erasing has not been completed (output branch N of the decision block 435).

Instead, if the hybrid memory location has the location indicator at the writing value (output branch $Y_{II}$ of the decision block 410), the set of selected operative pages corresponding to the address stored in the hybrid memory location is erased (block 460), and the method continues at block 465.

Finally, if the hybrid memory location has the location indicator at the verification value (output branch $Y_{III}$ of the decision block 410), the method continues directly to block 465. As before, at block 465 a refresh of the predefined operative pages associated with the hybrid location is performed, and the corresponding location indicator of the hybrid location is updated to the erased value (block 470). The method 400 then ends to the final double black circle 475.

The described approach is further advantageous as, in case of undesired interruption of electric power during the erasing phase, it allows restoring a correct managing of the service pages (and of the operative pages). In particular, this also ensures (along with the erasing of the corresponding set of selected operative pages, if desired) the correct managing of the refresh of the operative pages.

Naturally, to satisfy local and specific requirements, a person skilled in the art may apply to the approach described above many logical and/or physical modifications and alterations. More specifically, although this approach has been described with a certain degree of particularity with reference to one or more embodiments thereof, it should be understood that various omissions, substitutions and changes in the form and details as well as other embodiments are possible. Particularly, different embodiments may even be practiced without the specific details (such as the numerical examples) set forth in the preceding description to provide a more thorough understanding thereof. Conversely, well-known features may have been omitted or simplified in order not to obscure the description with unnecessary particulars. Moreover, it is expressly intended that specific elements and/or method steps described in connection with any embodiment of the disclosed approach may be incorporated in any other embodiment as a matter of general design choice. In any case, the terms including, comprising, having and containing (and any of their forms) should be understood with an open and non-exhaustive meaning (i.e., not limited to the recited elements), the terms based on, dependent on, according to, function of (and any of their forms) should be understood as a non-exclusive relationship (i.e., with possible further variables involved), and the term a should be understood as one or more elements (unless expressly stated otherwise).

For example, an embodiment proposes a method for managing a flash memory device comprising a plurality of pages of memory cells. The memory device is erasable at the level of the pages. The pages comprise a plurality of operative pages for storing operative values and a plurality of service pages for storing information relating to the erasing of the operative pages. In response to a request of erasing a set of (one or more) selected operative pages, the method comprises the following steps. A service page in use is determined among the service pages according to service information stored in the service pages. The presence of at least one service page to be erased is verified among the service pages according to the service information. At least one erasing pulse is applied to each service page to be erased. An address of the set of selected operative pages is written into the service page in use. The set of selected operative pages is erased. An indication of a completion of the erasing of the set of selected operative pages is written into the service page in use.

In any case, the approach according to an embodiment lends itself to be implemented through an equivalent method (by using similar steps, removing some non-essential steps, or adding additional optional steps). Moreover, the steps may be performed in a different order, in parallel or overlapped (at least in part). For example, more service pages may be provided, or different service information may be used (see below). In addition, the address of the set of selected pages may have any format (for example, equal to the address of the first page of the set, with the possible addition of a counter indicating the number of pages of the set following the first one). Moreover, although in the description explicit reference has been made to a single erasing pulse, this should not to be understood limitatively. In this regard, in fact, it is possible to provide that the above described distributed erasing (of the service pages) is carried out by applying an erasing signal comprising multiple pulses (for example, according to a certain percentage—such as 10%—of the series of pulses being estimated for the completion of the erasing).

According to an embodiment, the method further comprises, after the step of applying at least one erasing pulse to each service page to be erased, the steps of verifying the presence of at least one depleted memory cell in the service page to be erased, and soft-programming each depleted memory cell. However, the possibility of performing the restoring only after the completion of the erasing of the service page is not excluded.

According to an embodiment, the method further comprises, after the step of determining a service page in use among the service pages, the steps of selecting one of a plurality of memory locations of the service page in use (the selected location having a location indicator stored therein at a free value indicating that the selected location is free), and updating the location indicator of the selected location to a selection value indicating the occurred selection of the memory location of the service page in use. Moreover, the step of writing an indication of a completion of the erasing of the set of selected operative pages into the service page in use comprises updating the location indicator of the selected location to an erased value indicating the completion of the erasing of the set of selected operative pages.

However, the values above indicated of the location indicator may be represented in a different way, and they may be stored in different positions in the service pages. In any case, the same information may also be provided in a different way (for example, by a common counter pointing to the first free location in the service page in use).

According to an embodiment, the method further comprises the step of refreshing a set of predefined pages, the predefined pages having an address associated in a predefined way with a position of the selected location in the service page in use. However, number and type of the set of predefined pages may be chosen on the basis of specific design considerations. For example, it is possible to provide that each set comprises corresponding four predefined pages associated with the location (in any service page) of the word instead of the location, or it is possible to refresh one page at a time (with the completion of the refresh of the matrix that may also include multiple uses of each service page). In any case, a standard refresh algorithm may be used.

According to an embodiment, the step of determining a service page in use comprises determining the service page to which an occupation indicator, comprised within the service information, at an in-use value indicating that the service page is in use is associated. The step of verifying the presence of at least one service page to be erased comprises determining each service page to which an erasing indicator, comprised within the service information, at a to-be-started value or at an in-progress value indicating that the erasing of the service page has not been started yet or is in progress, respectively, is associated (with the erasing indicator that takes a completed value in response to a completion of the erasing of the associated service page to be erased). The step of selecting one of a plurality of memory locations of the service page in use further comprises, in response to an absence of location indicators at the free value in the service page in use, the step of updating the occupation indicator associated with the service page in use to a full value indicating that the service page in use has become full, and the occupation indicator associated with a service page having the empty value to the in-use value.

However, the above values of the occupation indicator and of the erasing indicator may be represented in a different way, and they may be stored in different positions within the service pages. In any case, it is possible to omit the step of verifying the completion of the erasing of each service page to be erased. In such case, the completed value of the erasing indicator may also not be desired—and hence it would be possible to provide a smaller number of bits for each page indicator.

According to an embodiment, the method further comprises, after the step of verifying the presence of at least one service page to be erased and/or the step of applying at least one erasing pulse to each service page to be erased, the step of updating the location indicator of the selected location to a verification value indicating the verification of the presence of at least one service page to be erased and/or the application of the at least one erasing pulse to each service page to be erased. However, such step (and the corresponding value of the location indicator) may not be desired, and it may also be omitted in a basic implementation.

According to an embodiment, the method further comprises, after the step of writing an address of the set of selected operative pages into the service page in use, the step of updating the location indicator of the selected location to a writing value indicating the occurred writing of the address of the set of selected operative pages into the service page in use. However, even in this case such step (and the corresponding value of the location indicator) may not be desired, and it may also be omitted in a basic implementation.

According to an embodiment, the method further comprises, at each power-on of the memory device, the following steps. The presence is verified in the service pages of a hybrid memory location having the location indicator at the selection value, at the verification value or at the writing value. If the hybrid memory location has the location indicator at the selection value, the presence of at least one service page to be erased is verified in the service pages according to the service information, and at least one erasing pulse is applied to each service page to be erased (with the erasing indicator associated with the service page to be erased that takes the completed value in response to the completion of the erasing of the service page to be erased). Otherwise, if the hybrid memory location has the location indicator at the writing value, the set of selected operative pages corresponding to the address being stored in the hybrid memory location is erased, and the location indicator of the hybrid location is updated to the erased value. However, the recovery of the service pages may be performed in any other way (for example, even just erasing the set of selected operative pages when desired, without applying any erasing pulse to the possible service pages to be erased).

According to an embodiment, the method further comprises, before the step of updating the location indicator of the hybrid location to the erased value, the step of refreshing the predefined pages associated with the hybrid location. However, as above such step may not be desired, and it may also be omitted in a basic implementation.

According to an embodiment, the service pages comprise two service pages, with each service page that comprises the occupation indicator of the service page and the erasing indicator of the other service page. However, nothing prevents from storing the occupation indicator and the erasing indicator in other positions.

An embodiment proposes a flash memory device comprising means or circuitry for performing the steps of the method described above. Similar considerations apply if the memory device has a different structure or comprises equivalent components. In any case, any of its components may be separated into several elements, or two or more components may be combined into a single element. In addition, each component may be replicated to support the execution of the corresponding operations in parallel. It should also be noted that (unless stated otherwise) any interaction between different components generally does not need be continuous, and it may be direct or indirect via one or more intermediaries.

For example, the pages should be understood in purely topological (and not physical) terms. In this regard, although the pages have been described and represented as rows of the memory matrix, they may comprise any physical and/or topological grouping of non-individually-erasable memory cells.

It should be readily understood that the proposed structure may be part of the design of an integrated circuit. The design may also be created in a programming language. Moreover, if the designer does not manufacture the electronic devices or the masks, the design may be transmitted by physical means to others. In any case, the resulting integrated circuit may be distributed by its manufacturer in raw wafer form, as a bare die, or in packages. Moreover, the proposed structure may be integrated with other circuits in the same chip, or it may be mounted in intermediate products (such as mother boards) and coupled with one or more other chips (such as a processor). In any case, the integrated circuit is suitable to be used in complex systems.

An embodiment proposes a system (for example, a mobile phone, a computer, and the like) comprising one or more of such flash memory devices. However, the flash memory device may be used in any other application, and it may be made and marketed as a stand-alone product.

An embodiment proposes a program comprising code for causing a data processing system to carry out the steps of the method described above when the program is running on the data processing system. In any case, similar considerations apply if the program is structured differently, or if additional modules or functions are provided. The program may take any form being suitable to be used by a data processing system or in connection with it, thereby configuring the system to perform the desired operations. Furthermore, it is possible to provide the program within any support usable by That which is claimed:

1. A method for managing a flash memory device comprising a plurality of memory cells arranged in pages, the flash memory device being erasable at a page level of the plurality of memory cells, the pages comprising a plurality of operative pages configured to store operative values and a plurality of service pages configured to store service information relating to erasing of the operative pages, the method comprising:
in response to a request of erasing selected operative pages
determining a service page in use from among the plurality of service pages based upon the service information,
identifying at least one service page to be erased among the service pages based upon the service information,
applying at least one erasing pulse to the at least one service page to be erased,
writing an address of the selected operative pages into the service page in use,
erasing the selected operative pages, and
writing an indication of a completion of the erasing of the selected operative pages into the service page in use.

2. The method according to claim 1, further comprising, after applying the at least one erasing pulse to each service page to be erased:
identifying at least one depleted memory cell of the plurality of memory cells in the service page to be erased; and
soft-programming the at least one depleted memory cell.

3. The method according to claim 1, further comprising, after determining a service page in use from among the plurality of service pages:
selecting one of a plurality of memory locations of the service page in use, the selected memory location having a location indicator stored therein at a free value indicating that the selected location is free; and
updating the location indicator of the selected memory location to a selection value indicating the occurred selection of the memory location of the service page in use;
the writing an indication of a completion of the erasing of the selected operative pages into the service page in use comprising updating the location indicator of the selected memory location to an erased value indicating the completion of the erasing of the selected operative pages.

4. The method according to claim 3, further comprising refreshing predefined pages having an address associated with a position of the selected memory location in the service page in use.

5. The method according to claim 3, wherein determining a service page in use comprises determining the service page to which an occupation indicator within the service information and having an in-use value indicating that the service page is in use is associated;
wherein identifying at least one service page to be erased comprises determining each service page to which an erasing indicator within the service information and having one of a to-be-started value and at a in-progress value indicating that the erasing of the service page has not been started yet and is in progress, respectively, is associated, the erasing indicator having a completed value based upon a completion of the erasing of the associated service page to be erased; and
wherein selecting one of the plurality of memory locations further comprises, based upon an absence of location indicators at the free value, updating the occupation indicator associated with the service page in use to a full value indicating that the service page in use has become full and the occupation indicator associated with a service page having the empty value to the in-use value.

6. The method according to claim 5, further comprising, after at least one of identifying at least one service page to be erased and the at least one service page to be erased, updating the location indicator of the selected location to a verification value indicating at least one of at least one service page to be erased and the application of the at least one erasing pulse to each service page to be erased.

7. The method according to claim 6, further comprising, after writing an address of the selected operative pages, updating the location indicator of the selected location to a writing value indicating that writing of the address of the selected operative pages into the service page in use has occurred.

8. The method according to claim 7, further comprising, at each power-on of the flash memory device:
identifying in the plurality of service pages of a hybrid memory location having the location indicator at at least one of the selection value, the verification value, and the writing value;
wherein if the hybrid memory location has the location indicator at the selection value
identifying at least one service page to be erased in the plurality of service pages according to the service information, and
applying at least one erasing pulse to each service page to be erased, the erasing indicator associated with the service page to be erased taking the completed value based upon the completion of the erasing of the service page to be erased; and
wherein if the hybrid memory location has the location indicator at the writing value
erasing the selected operative pages corresponding to the address stored in the hybrid memory location, and
updating the location indicator of the hybrid memory location to the erased value.

9. The method according to claim 8, further comprising:
refreshing predefined pages having an address associated with a position of the selected location in the service page in use; and
before updating the location indicator of the hybrid memory location to the erased value, refreshing the predefined pages associated with the hybrid memory location.

10. The method according to any claim 5, wherein the plurality of service pages comprise two service pages, each service page comprising the occupation indicator of the service page and the erasing indicator of the other service page.

11. A method for managing a memory device comprising a plurality of memory cells arranged in pages comprising a plurality of operative pages configured to store operative values and a plurality of service pages configured to store service information relating to erasing of the operative pages, the method comprising:
determining a service page in use from among the plurality of service pages based upon the service information;
identifying at least one service page to be erased among the service pages based upon the service information;

writing an address of selected operative pages to be erased into the service page in use;
erasing the selected operative pages; and
writing an indication of a completion of the erasing of the selected operative pages into the service page in use.

12. The method according to claim 11, further comprising:
identifying at least one depleted memory cell of the plurality of memory cells in the service page to be erased; and
soft-programming the at least one depleted memory cell.

13. The method according to claim 11, further comprising, after determining a service page in use from among the plurality of service pages:
selecting one of a plurality of memory locations of the service page in use, the selected memory location having a location indicator stored therein at a free value indicating that the selected location is free; and
updating the location indicator of the selected memory location to a selection value indicating the occurred selection of the memory location of the service page in use;
the writing an indication of a completion of the erasing of the selected operative pages into the service page in use comprising updating the location indicator of the selected memory location to an erased value indicating the completion of the erasing of the selected operative pages.

14. A non-transitory computer-readable medium for managing a flash memory device comprising a plurality of memory cells arranged in pages, the flash memory device being erasable at a page level of the plurality of memory cells, the pages comprising a plurality of operative pages configured to store operative values and a plurality of service pages configured to store service information relating to erasing of the operative pages, the non-transitory computer-readable medium having computer-readable instructions for performing, the steps comprising:
in response to a request of erasing selected operative pages
determining a service page in use from among the plurality of service pages based upon the service information,
identifying at least one service page to be erased among the service pages based upon the service information,
applying at least one erasing pulse to the at least one service page to be erased,
writing an address of the selected operative pages into the service page in use,
erasing the selected operative pages, and
writing an indication of a completion of the erasing of the selected operative pages into the service page in use.

15. The non-transitory computer-readable medium according to claim 14, further having computer-executable instructions for performing, after applying the at least one erasing pulse to each service page to be erased, the steps comprising:
identifying at least one depleted memory cell of the plurality of memory cells in the service page to be erased; and
soft-programming the at least one depleted memory cell.

16. The non-transitory computer-readable medium according to claim 14, further having computer-executable instructions for performing, after determining a service page in use from among the plurality of service pages, the steps comprising:
selecting one of a plurality of memory locations of the service page in use, the selected memory location having a location indicator stored therein at a free value indicating that the selected location is free; and
updating the location indicator of the selected memory location to a selection value indicating the occurred selection of the memory location of the service page in use;
the writing an indication of a completion of the erasing of the selected operative pages into the service page in use comprising updating the location indicator of the selected memory location to an erased value indicating the completion of the erasing of the selected operative pages.

17. The non-transitory computer-readable medium according to claim 16, further having computer-executable instructions for performing the step of refreshing predefined pages having an address associated with a position of the selected memory location in the service page in use.

18. The non-transitory computer-readable medium according to claim 16, wherein the computer-executable instructions for performing the step of determining a service page in use comprises computer-executable instructions for performing the step of determining the service page to which an occupation indicator within the service information and having an in-use value indicating that the service page is in use is associated;
wherein the computer-executable instructions for performing the step of identifying at least one service page to be erased comprises computer-executable instructions for performing the step of determining each service page to which an erasing indicator within the service information and having one of a to-be-started value and at a in-progress value indicating that the erasing of the service page has not been started yet and is in progress, respectively, is associated, the erasing indicator having a completed value based upon a completion of the erasing of the associated service page to be erased; and
wherein the computer-executable instructions for performing the step of selecting one of the plurality of memory locations further comprises computer-executable instructions for performing the step of, based upon an absence of location indicators at the free value, updating the occupation indicator associated with the service page in use to a full value indicating that the service page in use has become full and the occupation indicator associated with a service page having the empty value to the in-use value.

19. The non-transitory computer-readable medium according to claim 18, further having computer-executable instructions for performing, after at least one of identifying at least one service page to be erased and applying at least one erasing pulse to the at least one service page to be erased, the step of updating the location indicator of the selected location to a verification value indicating at least one of at least one service page to be erased and the application of the at least one erasing pulse to each service page to be erased.

20. The non-transitory computer-readable medium according to claim 19, further having computer-executable instructions for performing, after writing an address of the selected operative pages, the step of updating the location indicator of the selected location to a writing value indicating that writing of the address of the selected operative pages into the service page in use has occurred.

21. A flash memory device comprising:
a plurality of memory cells arranged in pages, the pages comprising a plurality of operative pages configured to store operative values and a plurality of service pages configured to store service information relating to erasing of the operative pages; and control circuitry coupled to said plurality of memory cells and configured to, in response to a request of erasing a set of selected operative pages determine a service page in use from among the plurality of service pages based upon the service information, identify at least one service page to be erased among the service pages based upon the service information, apply at least one erasing pulse to the at least one service page to be erased, write an address of the selected operative pages into the service page in use, erase the selected operative pages, and write an indication of a completion of the erasing of the selected operative pages into the service page in use.

22. The flash memory device according to claim 21, wherein said control circuitry is configured to, after applying the at least one erasing pulse to each service page to be erased identify at least one depleted memory cell of said plurality of memory cells in the service page to be erased; and soft-program said at least one depleted memory cell.

23. The flash memory device according to claim 21, wherein said control circuitry is configured to, after determining a service page in use from among the plurality of service pages:

select one of a plurality of memory locations of the service page in use, the selected memory location having a location indicator stored therein at a free value indicating that the selected location is free; and update the location indicator of the selected memory location to a selection value indicating the occurred selection of the memory location of the service page in use;

wherein the control circuitry is configured to write an indication of a completion of the erasing of the selected operative pages into the service page in use comprising updating the location indicator of the selected memory location to an erased value indicating the completion of the erasing of the selected operative pages.

24. The flash memory device according to claim 23, wherein said control circuitry is configured to refresh predefined pages having an address associated with a position of the selected memory location in the service page in use.

25. The flash memory device according to claim 23, wherein said control circuitry is configured to determine a service page in use comprises determining the service page to which an occupation indicator within the service information and having an in-use value indicating that the service page is in use is associated;

wherein said control circuitry is configured to identify at least one service page to be erased by determining each service page to which an erasing indicator within the service information and having one of a to-be-started value and at a in-progress value indicating that the erasing of the service page has not been started yet and is in progress, respectively, is associated, the erasing indicator having a completed value based upon a completion of the erasing of the associated service page to be erased; and wherein said control circuitry is configured to select one of the plurality of memory locations further comprises, based upon an absence of location indicators at the free value, by updating the occupation indicator associated with the service page in use to a full value indicating that the service page in use has become full and the occupation indicator associated with a service page having the empty value to the in-use value.

26. The flash memory device according to claim 25, wherein said control circuitry is configured to, after at least one of identifying at least one service page to be erased and applying at least one erasing pulse to the at least one service page to be erased, update the location indicator of the selected location to a verification value indicating at least one of at least one service page to be erased and the application of the at least one erasing pulse to each service page to be erased.

27. The flash memory device according to claim 26, wherein said control circuitry is configured to, after writing an address of the selected operative pages, update the location indicator of the selected location to a writing value indicating that writing of the address of the selected operative pages into the service page in use has occurred.

* * * * *